United States Patent
Pei et al.

(10) Patent No.: US 8,299,530 B2
(45) Date of Patent: Oct. 30, 2012

(54) STRUCTURE AND METHOD TO FABRICATE PFETS WITH SUPERIOR GIDL BY LOCALIZING WORKFUNCTION

(75) Inventors: Chengwen Pei, Hopewell Junction, NY (US); Roger A. Booth, Jr., Hopewell Junction, NY (US); Kangguo Cheng, Albany, NY (US); Joseph Ervin, Hopewell Junction, NY (US); Ravi M. Todi, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/717,375

(22) Filed: Mar. 4, 2010

(65) Prior Publication Data
US 2011/0215412 A1    Sep. 8, 2011

(51) Int. Cl.
*H01L 27/12* (2006.01)
*H01L 21/8238* (2006.01)

(52) U.S. Cl. .......... 257/351; 257/69; 257/274; 257/369; 257/E27.046; 257/E27.064; 257/E27.108; 257/E21.632; 438/199; 438/217; 438/522; 438/525; 438/530

(58) Field of Classification Search .................. 438/199, 438/217, 530, 522, 525; 257/69, 274, 351, 257/369, E27.046, E27.064, E27.108, E21.632
See application file for complete search history.

(56) References Cited

U.S. PATENT DOCUMENTS

| | | | |
|---|---|---|---|
| 5,972,783 A * | 10/1999 | Arai et al. | 438/513 |
| 7,023,055 B2 | 4/2006 | Ieong et al. | |
| 7,329,923 B2 | 2/2008 | Doris et al. | |
| 2004/0188767 A1 * | 9/2004 | Weber et al. | 257/369 |
| 2005/0116290 A1 | 6/2005 | de Souza et al. | |
| 2008/0017930 A1 * | 1/2008 | Kim et al. | 257/369 |
| 2009/0020825 A1 * | 1/2009 | Doczy et al. | 257/369 |
| 2009/0090975 A1 * | 4/2009 | Ong et al. | 257/369 |
| 2009/0093095 A1 * | 4/2009 | Obradovic et al. | 438/231 |

* cited by examiner

*Primary Examiner* — Michelle Mandala
(74) *Attorney, Agent, or Firm* — Scully, Scott, Murphy & Presser, P.C.; H. Daniel Schnurmann (57) ABSTRACT

A semiconductor structure and a method of forming the same are provided in which the gate induced drain leakage is controlled by introducing a workfunction tuning species within selected portions of a pFET such that the gate/SD (source/drain) overlap area of the pFET is tailored towards flatband, yet not affecting the workfunction at the device channel region. The structure includes a semiconductor substrate having at least one patterned gate stack located within a pFET device region of the semiconductor substrate. The structure further includes extension regions located within the semiconductor substrate at a footprint of the at least one patterned gate stack. A channel region is also present and is located within the semiconductor substrate beneath the at least one patterned gate stack. The structure further includes a localized workfunction tuning area located within a portion of at least one of the extension regions that is positioned adjacent the channel region as well as within at least a sidewall portion of the at least one gate stack. The localized workfunction tuning area can be formed by ion implantation or annealing.

15 Claims, 4 Drawing Sheets

FIG. 8 ial structure including at least
STRUCTURE AND METHOD TO FABRICATE PFETS WITH SUPERIOR GIDL BY LOCALIZING WORKFUNCTION

BACKGROUND

The present invention relates to a semiconductor structure and a method of fabricating the same. More particularly, the present invention relates to a semiconductor structure including at least one pFET having superior, i.e., reduced, gate induced drain leakage (GIDL) and a method of fabricating such a semiconductor structure.

As semiconductor device geometries continue to shrink, reliability problems due to gate induced drain leakage (GIDL) current force operation at voltages which are lower than desired for best device performance.

The GIDL current results from the generation of electron-hole pairs in the surface drain depletion region of a field effect transistor (FET) along the area where the gate conductor overlaps the drain diffusion region, when the device is biased such that the drain potential is more positive (greater than +1V) than the gate potential in an n-type field effect transistor (nFET), and when the gate potential is more positive (greater than +1V) than the drain potential in a p-type field effect transistor (pFET).

SUMMARY OF THE INVENTION

The present invention provides a semiconductor structure and a method of forming the same in which the gate induced drain leakage is controlled by introducing a workfunction tuning species within selected portions of a pFET such that the gate/SD (source/drain) overlap area is tailored towards flatband, yet not affecting the workfunction at the device channel region.

In one aspect of the present invention, a semiconductor structure is provided that includes a semiconductor substrate having at least one patterned gate stack located within a pFET device region of the semiconductor substrate. The structure further includes extension regions located within the semiconductor substrate at a footprint of the at least one patterned gate stack. A channel region is also present and is located within the semiconductor substrate beneath the at least one patterned gate stack. The structure further includes a localized workfunction tuning area located within a portion of at least one the extension regions that is positioned adjacent the channel region as well as within at least one sidewall portion of the at least one gate stack.

The presence of the localized workfunction tuning area within the pFET device region is believed to control the gate induced drain leakage (GIDL) by modifying the local workfunction at the gate/SD (source/drain) overlap region. Moreover, the presence of the localized workfunction tuning area within the pFET device region shifts the workfunction of the at least one gate stack towards flatband at the gate/SD overlap region so that the gate induced drain leakage (GIDL) is reduced, while the workfunction within the device channel is not changed. In one embodiment, the localized workfunction tuning area can be present on both sides of the at least one gate stack. In another embodiment, the localized workfunction tuning area is present on one side, such as, for example, the drain side, of the at least one gate stack. When present on one side of the gate stack, an asymmetric pFET can be formed.

In another aspect of the invention, a method of fabricating the aforementioned semiconductor structure is provided. In one embodiment, the method includes forming at least one patterned gate stack within a pFET device region of a semiconductor substrate. Extension regions are then formed within the semiconductor substrate at a footprint of the at least one patterned gate stack. The extension regions define a channel region located beneath the at least one patterned gate stack. A workfunction tuning species is thereafter introduced into a portion of at least one of the extension regions that is positioned adjacent to the channel region of the at least one patterned gate stack as well as into a sidewall portion of the at least one patterned gate stack.

In one embodiment, the introducing of the workfunction tuning species may be performed by utilizing an angled ion implantation process in which the workfunction tuning species is employed as the implant ion. In another embodiment, the introducing of the workfunction tuning species may be performed by an annealing process in which an annealing atmosphere including at least the workfunction tuning species is employed.

DETAILED DESCRIPTION OF THE DRAWINGS

The present invention, which provides a semiconductor structure having superior, i.e., reduced, gate induced drain leakage and a method of fabricating such a semiconductor structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is first made to FIGS. 1-6 which are pictorial representations (through cross sectional views) illustrating an exemplary semiconductor structure of the present invention through various processing steps in accordance with one embodiment of the invention. In this embodiment, an angled implant is performed to localize the workfunction of a patterned gate stack within a pFET device region of a semiconductor structure. Also, within this embodiment, a localized workfunction tuning area is formed into both the extension regions as well as both sidewall portions of the patterned gate stack. Although such an embodiment is described and illustrated, the present invention can also be used to form a localized workfunction tuning area on one side, either the source side or the drain side, of the at least one patterned gate stack.

Figure 1:
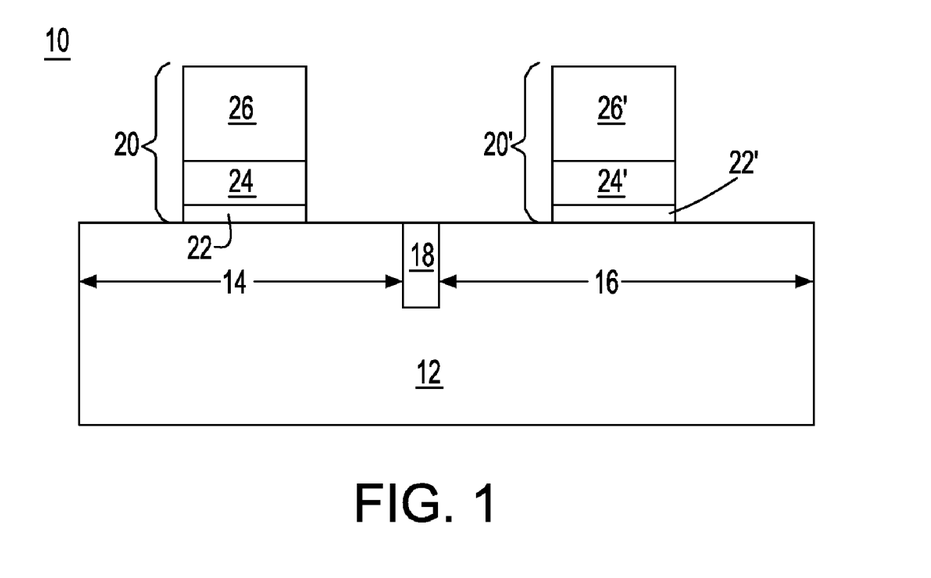
FIG. 1 is a pictorial representation (through a cross sectional view) depicting an initial structure including at least one patterned gate stack located on a surface of a semiconductor substrate in an nFET device region and at least one patterned gate stack located on a surface of the semiconductor substrate in a pFET device region that can be employed in one embodiment of the invention.

Specifically, FIG. 1 illustrates an initial structure 10 that can be employed in this embodiment of the invention. The initial structure 10 includes a semiconductor substrate 12 which has at least one nFET device region 14 and at least one pFET device region 16 that are separated by an isolation region 18. The initial structure 10 also includes at least one gate stack 20 located within the at least one nFET device region 14 and at least one gate stack 20' located within the at least one pFET device region 16.

It is noted that although the drawings and following discussion illustrate the presence of at least one nFET device region 14 including the at least one gate stack 20, the present invention also works in cases in which the at least one nFET device region is omitted. That is, the invention which is described in greater detail herein below works for structures in which only at least one pFET device region 16 including at least one gate stack 20' is present in the structure.

The initial structure 10 illustrated in FIG. 1 is composed of materials that are well known to those skilled in the art. Also, the initial structure 10 can be fabricated utilizing processing techniques that are also well known to those skilled in the art. For example, deposition, lithography and etching can be used in forming the patterned gate stacks shown in FIG. 1 or a replacement gate process can be used in forming the patterned gate stacks shown in FIG. 1.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments, the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region 18 can be formed into the semiconductor substrate 12. The at least one isolation region 18 is typically formed prior to forming either the patterned gate stacks within the different device regions. The at least one isolation region 18 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region 18 provides isolation between neighboring gate regions, typically required when the neighboring gates have opposite conductivities, i.e., nFETs and pFETs. As such, the at least one isolation region 18 separates the at least one nFET device region 14 from the at least one pFET device region 16.

After forming the at least one isolation region 18, the patterned gate stacks shown in FIG. 1 can be formed utilizing one of the above mentioned techniques. The patterned gate stack 20 within the nFET device region 14 includes, from bottom to top, a high k gate dielectric 22, a metal electrode 24 and a Si-containing electrode 26. The patterned gate stack 20' within the nFET device region 16 includes, from bottom to top, a high k gate dielectric 22', a metal electrode 24' and a Si-containing electrode 26'. In some embodiments of the invention, the Si-containing electrode may be omitted from one or both of the different device regions.

The patterned gate stacks 20, 20' within the different device regions may be composed of the same or different materials, including the same or different high k gate dielectric material, the same or different metal gate electrode and/or the same or different Si-containing electrode. When different materials are present in the patterned gate stacks, block mask technology can be used to form the different materials within each of the device regions.

Each of the materials within the patterned gate stacks 20, 20' is now described in greater detail. The high k gate dielectrics 22, 22' may be composed of the same or different high k gate dielectric material; the term "high k" when referring to the high k gate dielectrics 22, 22' denotes a dielectric material, typically, a metal oxide, having a dielectric constant that is greater than the dielectric constant of silicon oxide, e.g., 3.9. Typically, the high k gate dielectric material(s) that is employed in the present invention has a dielectric constant greater than 4.0, with a dielectric constant of greater than 8.0 being even more typical. Exemplary high k dielectric materials that can be employed as high k gate dielectrics 22, 22' include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 22, 22'. Each value of x is independently from 0.5 to 3 and each value of y is independently from 0 to 2.

The thickness of the high k gate dielectrics 22, 22' may vary depending on the technique used to form the same. Typically, however, the high k gate dielectrics 22, 22' have a thickness from 0.5 nm to 10 nm, with a thickness from 1.0 nm to 5 nm being more typical. The high k gate dielectrics 22, 22' employed may have an effective oxide thickness on the order of, or less than, 1 nm. In some embodiments, the high gate dielectric 22 has the same thickness as the high gate dielectric 22'. In yet other embodiments, the high k gate dielectric 22 has a different thickness than high gate dielectric 22'.

The high k gate dielectrics 22, 22' can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

The metal gate electrodes 24, 24' may be composed of the same or different metal-containing conductive material. Examples of metal-containing conductive materials that can be employed as the metal gate electrodes include, but are not limited to an elemental metal (e.g., tungsten, titanium, tantalum, aluminum, nickel, ruthenium, palladium, and platinum), an alloy of at least one elemental metal, an elemental nitride (e.g., tungsten nitride, aluminum nitride, and titanium nitride), an elemental metal silicide (e.g., tungsten silicide, nickel silicide, platinum silicide, and titanium silicide) or multilayers thereof. In one embodiment, each of the metal gate electrodes 24, 24' in the different device regions is an elemental metal nitride such as, for example, titanium nitride.

The thickness of the metal gate electrodes 24, 24' may vary depending on the technique used to form the same. Typically, however, the metal gate electrodes 24, 24' have a thickness from 5 nm to 50 nm, with a thickness from 10 nm to 30 nm being more typical. In some embodiments, the metal gate electrode 24 has the same thickness as the metal gate electrode 24'. In yet other embodiments, the metal gate electrode 24 has a different thickness than metal gate electrode 24'.

The metal gate electrodes 24, 24' can be formed atop the high k gate dielectrics 22, 22' utilizing techniques that are well known to those skilled in the art. In one embodiment, the metal gate electrodes 24, 24' are formed utilizing a conventional deposition process including, but not limited to chemical vapor deposition (CVD), plasma enhanced chemical vapor deposition (PECVD), evaporation, physical vapor deposition (PVD), sputtering, chemical solution deposition, and atomic layer deposition (ALD). When a metal silicide is formed, a conventional silicide process can be employed.

When present, the Si-containing electrodes 26, 26' include a doped layer of silicon or a doped layer of a silicon germanium alloy in single crystal, polycrystalline or amorphous form. In some embodiments, the Si-containing electrode 26 is composed of the same doped layer as that of Si-containing electrode 26'. In yet other embodiments, the Si-containing electrode 26 is composed of a different doped layer than the Si-containing electrode 26'. In yet a further embodiment, at least the Si-containing electrode 26' within the at least one pFET device region 16 is composed of a doped layer of polysilicon. The dopant (n-type or p-type) can be introduced in the Si-containing electrodes 26, 26' during the formation of a blanker layer of a Si-containing electrode material or after deposition thereof utilizing, for example, ion implantation or gas phase doping.

The thickness of the Si-containing electrodes 26, 26' can vary depending on the technique employed in forming the same. Typically, however, the Si-containing electrodes 26, 26' have a thickness from 10 nm to 100 nm, with a thickness from 30 nm to 50 nm being more typical. In some embodiments, the Si-containing electrode 26 has the same thickness as the Si-containing electrode 26'. In yet other embodiments, the Si-containing electrode 26 has a different thickness than Si-containing electrode 26'.

The Si-containing electrodes 26, 26' can be formed utilizing a conventional deposition process including, but not limited to chemical vapor deposition, plasma enhanced chemical vapor deposition, atomic layer deposition, and evaporation.

Figure 2:
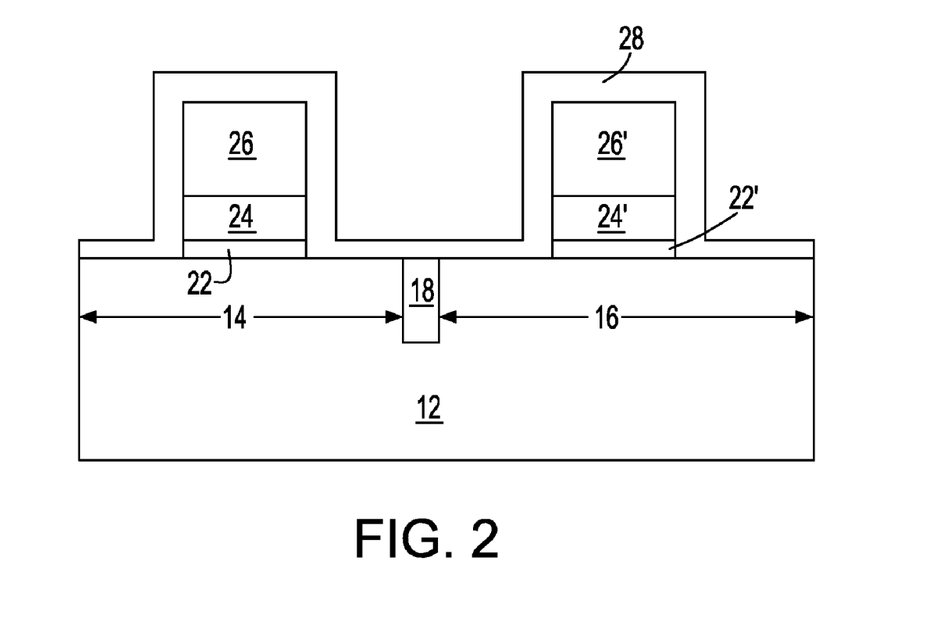
FIG. 2 is a pictorial representation (through a cross sectional view) depicting the structure of FIG. 1 after forming a dielectric liner on the exposed surfaces of the initial structure.

Referring to FIG. 2, there is illustrated the structure of FIG. 1 after a dielectric liner 28 is formed all of the exposed surfaces of the structure. The dielectric liner 28 is composed of an oxide, a nitride, an oxynitride, or any multilayered combination thereon. In one embodiment, the dielectric liner 28 is comprised of a nitride, such as silicon nitride. The thickness of the dielectric liner 28 may vary depending on a number of factors including, for example, the number of layers within the dielectric liner 28, and the technique that is employed in fabricating the same. Typically, the dielectric liner 28 has a thickness from 5 nm to 50 nm, with a thickness from 10 nm to 30 nm being more typical. The dielectric liner 28 can be formed utilizing any conventional conformal deposition processing including, for example, chemical vapor deposition (CVD), plasma enhanced chemical vapor deposition (PECVD), evaporation, and chemical solution deposition.

Figure 3:
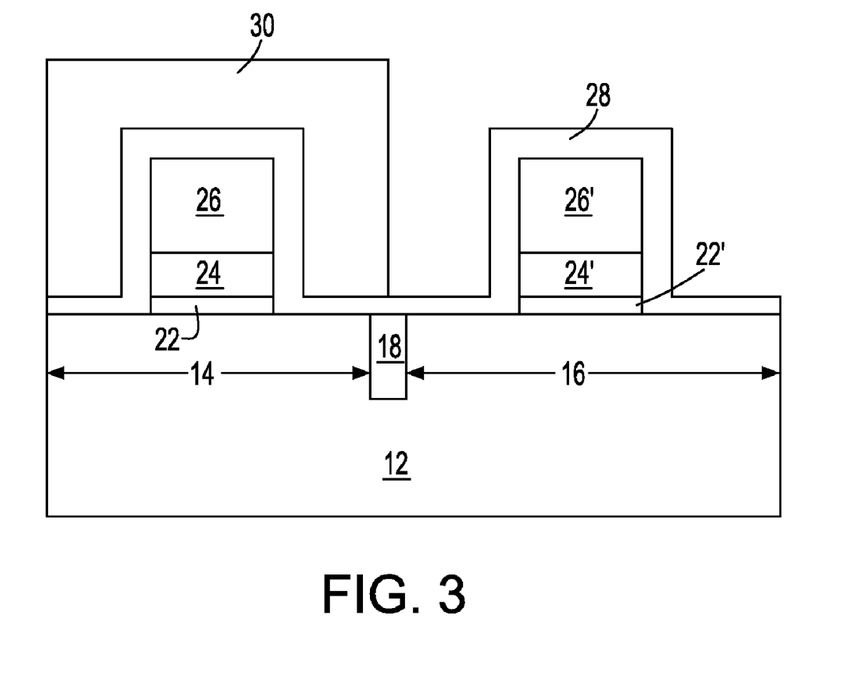
FIG. 3 is a pictorial representation (through a cross sectional view) depicting the structure of FIG. 2 after forming a patterned mask within the nFET device region, while leaving the pFET device region exposed.

Referring to FIG. 3, there is illustrated the structure of FIG. 2 after forming a patterned mask 30 within the at least one nFET device region 14, while leaving the at least one pFET device region 16 exposed. It is observed that this step of the invention as well as the formation of the dielectric liner 28 can be omitted in embodiments in which the least one nFET device region 14 is not present. When employed, the patterned mask 30 can be composed of a hardmask material (e.g., an oxide, a nitride, and/or an oxynitride) and/or a photoresist. Typically, and when the patterned mask 30 is a hardmask, the hardmask is composed of silicon oxide and/or silicon nitride.

In embodiments in which the patterned mask 30 is composed of a hardmask, the patterned mask is formed by depositing at least one hardmask material, forming a patterned resist by lithography on the surface of the hardmask material within the at least one nFET device region and removing the hardmask material from the at least one pFET device region by etching. The patterned resist is typically stripped after etching. The etch that can be employed in this embodiment includes a dry etching process (i.e., one of reactive ion etching, plasma etching, and ion beam etching) and/or chemical wet etching. As shown, the etch typically stops atop the dielectric liner 28 within the at least one pFET device region 16. In some embodiments, this etch can also by used to remove the exposed dielectric liner 28 from the at least one pFET device region 16. In embodiments in which the patterned mask 30 is composed of a photoresist, the patterned mask 30 can be formed by depositing a conventional photoresist material onto the structure shown in FIG. 2 and then subjecting the disposed photoresist to lithography. The lithography step includes exposing the disposed photoresist to a desired patterned of radiation and developing the exposed resist utilizing a conventional resist developer.

Notwithstanding which technique is employed in forming the patterned mask 30, the patterned mask 30 has a thickness which is sufficient to prevent ions from being implanted within the at least one nFET device region 14. Typically, the patterned mask 30 has a thickness from 10 nm to 200 nm, with a thickness from 20 nm to 100 nm being more typical.

Figure 4:
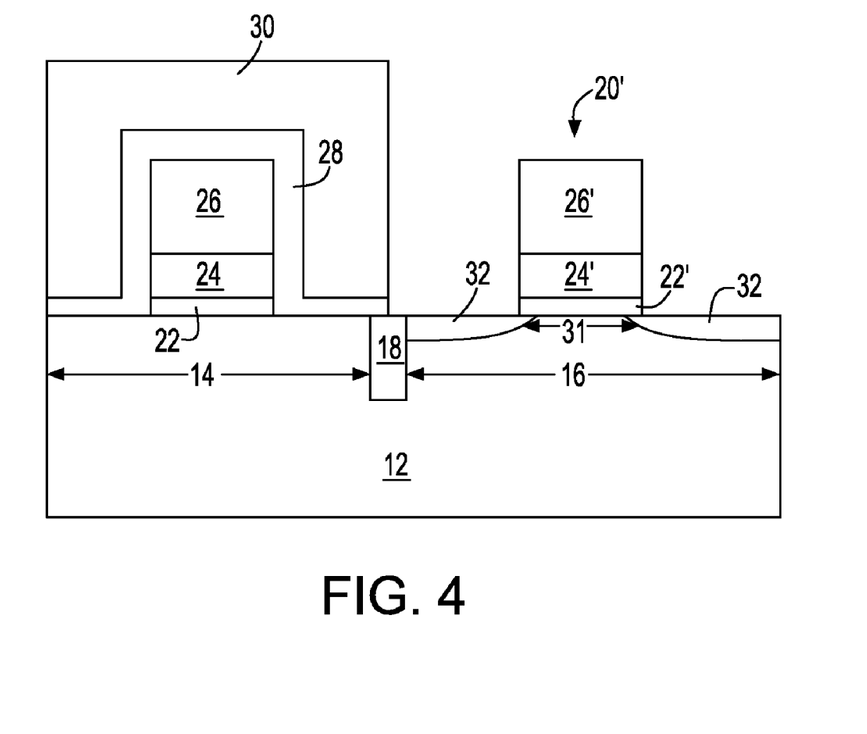
FIG. 4 is a pictorial representation (through a cross sectional view) depicting the structure of FIG. 3 after removing the dielectric liner from the pFET device region and after forming extension regions within the substrate at the footprint of the at least one patterned gate stack within the pFET device region.

Referring now to FIG. 4, there is illustrated the structure of FIG. 3 after removing the exposed dielectric liner 28 from the at least one pFET device region 16 and forming at least extension regions 32 within the semiconductor substrate 12 at the footprint of the at least one patterned gate stack 20'. As was mentioned above, the removal of the dielectric liner 28 from the at least one pFET device region 16 may occur within the same step as removing the patterned mask material from this device region. In embodiments, in which the dielectric liner 28 was not previously removed from the at least one pFET device region 16, an etching process (e.g., dry etching or a chemical wet etch) can be employed. In one embodiment in which the dielectric liner 28 includes silicon nitride, the etch can include hydrofluoric acid (HF), buffered HF, or phosphoric acid ($H_3PO_4$) solutions.

The extension regions 32 are formed utilizing any conventional extension ion implantation process that is well known to those skilled in the art. During the extension ion implantation process, the at least one patterned gate stack 20' within the pFET device region 16 functions as an implantation mask. As such, the extension implant does not occur in the area of the semiconductor substrate 12 that is directly beneath the at least one patterned gate stack 20'. The area of the semiconductor substrate 12 that is located directly beneath the at least one patterned gate stack 20' and confined by the extension regions 32 is referred to as the device channel, or channel region 31 for short. The extension implant occurs in the area of the semiconductor substrate 12 that is at the footprint of the at least one patterned gate stack 20'.

After the extension ion implantation process, a halo implant region (not shown) can be formed within the semiconductor substrate 12 utilizing any conventional halo implantation process that is also well known to those skilled in the art. In one embodiment, the extension regions 32 and optionally the halo implant can be activated at this point of the invention utilizing a conventional extension activation anneal process. In yet another embodiment of the invention, the extension regions 32 and optionally the halo implant can be activated during a subsequent thermal process such as, for example, during the activation of the source region and the drain region.

Figure 5:
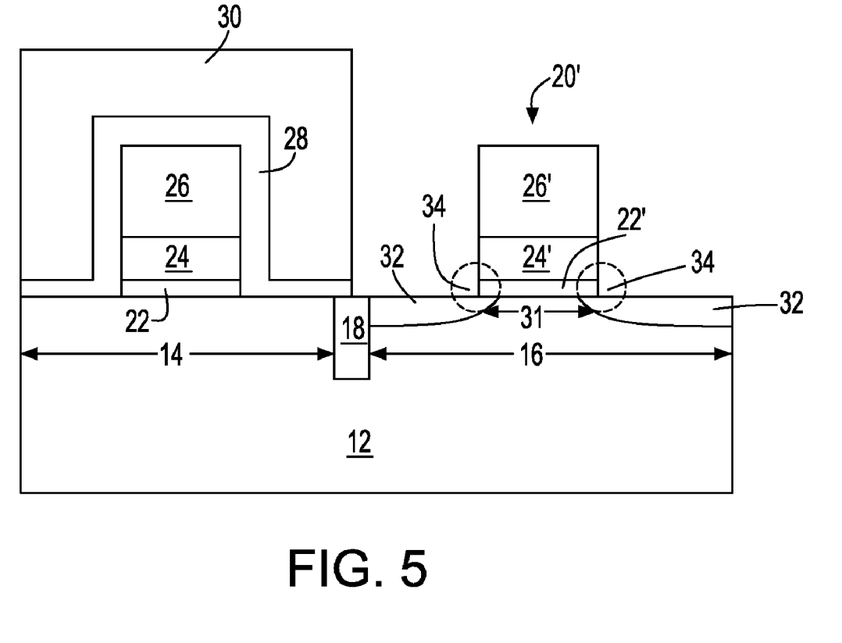
FIG. 5 is a pictorial representation (through a cross sectional view) depicting the structure of FIG. 4 after performing an angled implant in which a workfunction tuning species is implanted into portions of the extension regions as well as into sidewall portions of the at least one patterned gate stack within the pFET device region.

Referring now to FIG. 5, there is illustrated the structure of FIG. 4 after incorporating a workfunction tuning species into a portion of the extension regions 32 that is positioned adjacent to the channel region 31 and into sidewall portions of the exposed gate stack 20' within the pFET device region 16. The areas in which the workfunction tuning species are incorporated into the structure are designated by circles shown in FIG. 5 and are labeled as element 34 within the drawings. Area 34 can be referred to as a localized workfunction tuning species area or a localized interface charge containing area. Area 34 may be larger or smaller than shown depending on the conditions of the angled implant. It is observed that the workfunction tuning species is introduced into portions of the extension regions 32 that are located next to the channel region 31 in which the gate overlaps the source region and the drain region, both to be subsequently formed.

The workfunction tuning species can be incorporated into the areas of the structure described above by utilizing an angled ion implantation step. The angled ion implantation step that can be employed in forming the workfunction tuning containing species area 34 is typically performed at a tilt angle from 5° to 45°, with a tilt angle from 10° to 20° being more typical. The workfunction tuning species that can be incorporated into the pFET device region 16 includes any species that can move the workfunction of the gate/SD overlap area towards the pFET flatband edge. Examples of suitable workfunction tuning species that can be employed in the present invention include, but are not limited to fluorine, bromine, chlorine, iodine, oxygen, sulfur, and mixtures thereof. In one embodiment, fluorine is employed as the workfunction tuning species.

The dosage of the workfunction tuning species that is incorporated within the areas mentioned above can vary depending on the exact species of the workfunction tuning species being employed. Typically, the dosage of the workfunction tuning species that can be incorporated within the pFET device area 16 is from 10E13 atoms/cm$^2$ to 10E19 atoms/cm$^2$, with a dosage from 10E14 atoms/cm$^2$ to 10E18 atoms/cm$^2$ being more typical.

The workfunction tuning could happen on both sides of the pFET stack or just one side such as, for example, the drain side, for asymmetric devices, for different applications. Implantation could occur in two ways or four ways considering the device layout.

After performing the angled ion implantation step, the patterned mask 30 and at least a portion of, or all of, the dielectric liner 28 is removed from the at least one nFET device region 14 and thereafter conventional CMOS processing can be performed. In embodiments in which the patterned mask 30 is composed of a photoresist, the removal of the patterned mask 30 from the at least one nFET device region 14 can include a conventional resist stripping process. When the patterned mask 30 is composed of a hardmask, an etching process as described above for removing the hardmask from the at least one pFET device region 16 can be employed. The partial or complete removal of the dielectric liner 28, which may include one of the above etching steps used in removing the dielectric liner 28 from the at least one pFET device region 16, can be performed in the same or different step as that of removing the patterned mask 30. In some embodiments, the partial removal of the dielectric liner 28 from the nFET device region 14 can be used in forming a gate spacer for the at least one patterned gate stack 20 within the at least one nFET device region 14.

Figure 6:
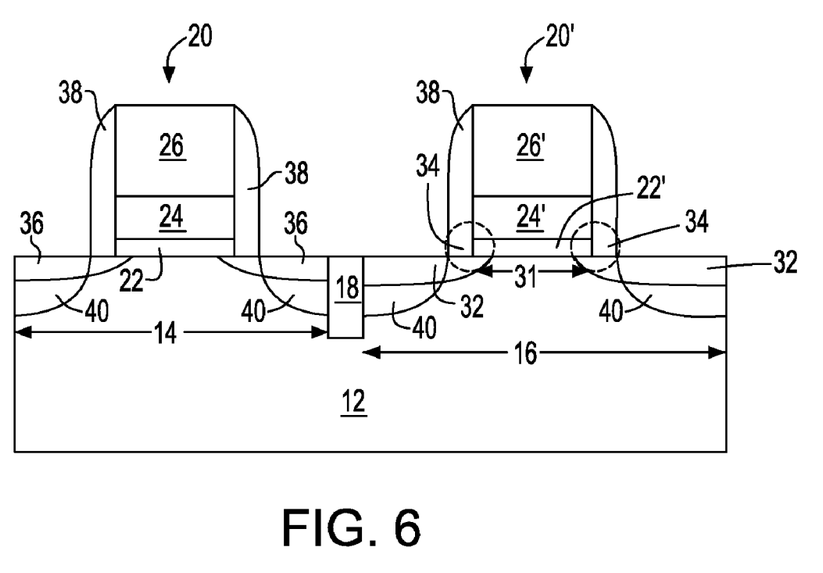
FIG. 6 is a pictorial representation (through a cross sectional view) depicting the structure of FIG. 5 after removing the patterned mask from the nFET device region and after further CMOS processing steps have been performed.

FIG. 6 shows one possible structure that can be formed after further CMOS processing steps, including, but not limited to the formation of extension regions 36 within the nFET device region 14, the formation of at least one spacer 38 on the sidewalls of each of the patterned gate stacks 20, 20', and the formation of a source region and a drain region, collectively referred to herein as source/drain regions 40. The formation of the extension regions 36, at least one spacer 38 and source/drain regions 40 include conventional techniques that are well known to those skilled in the art. The details concerning the formation of the extension regions 36, at least one spacer 38 and source/drain regions 40 have been omitted so as not to obscure the present invention. The at least one spacer 38 can include an oxide, a nitride, an oxynitride or any multilayered combination thereof.

Other CMOS processing steps can also be employed including, for example, formation of metal semiconductor alloy contact regions, formation of one or more stress liners, formation of a middle of the line dielectric material, and formation of metal contact vias within the middle of the liner dielectric.

In another embodiment of the invention, the workfunction tuning species can be incorporated into a portion of the extension regions 32 that is positioned adjacent the channel region 31 as well as into sidewall portions of the at least one patterned gate stack 20' within the at least one pFET device region 16 by utilizing an anneal step in which the anneal atmosphere includes at least one of the above mentioned workfunction tuning species. This embodiment of the invention, which represents a second embodiment, begins by first providing the structure shown in FIG. 4. After forming the structure shown in FIG. 4, the patterned mask 30 is removed from the at least one nFET device region 14 of the structure utilizing one of the techniques mentioned above. The removal of the patterned mask 30 from the at least one nFET device region 14 exposes the underlying dielectric liner 28. An etching process is then employed which converts the dielectric liner 28 within the nFET device region 14 into a dielectric spacer 28' that is located on sidewalls of the patterned gate stack 20 within the nFET device region 14. Another spacer 50 can then be formed in each of the device regions providing the structure shown in FIG. 7. The another spacer 50, which can be formed by deposition and etching, is composed of an oxide, a nitride, an oxynitride or any multilayered combinations thereof.

Figure 7:
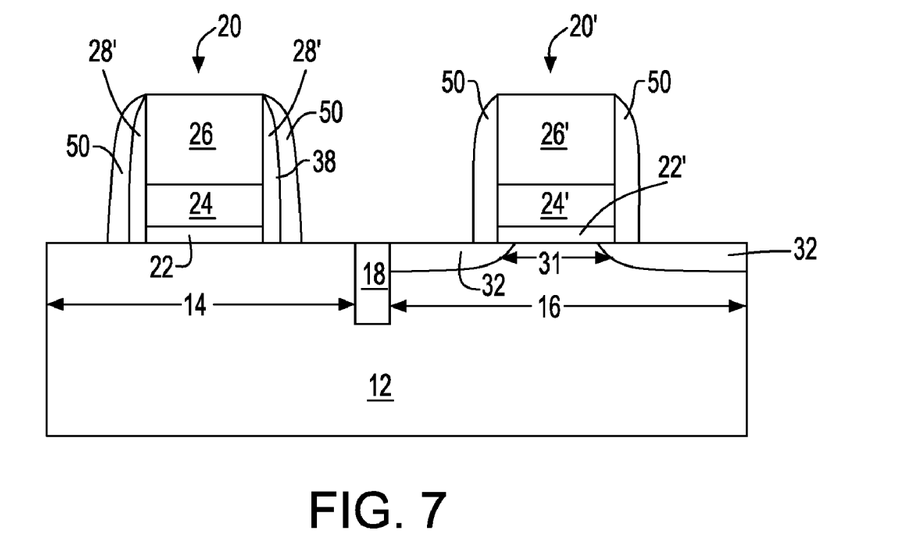
FIG. 7 is a pictorial representation (through a cross sectional view) depicting the structure of FIG. 4 after removing the patterned mask from the nFET device region, formation of a dielectric spacer within the nFET device region and formation of another spacer in both the nFET device region and the pFET device region in accordance with a second embodiment of the invention.
Figure 8:
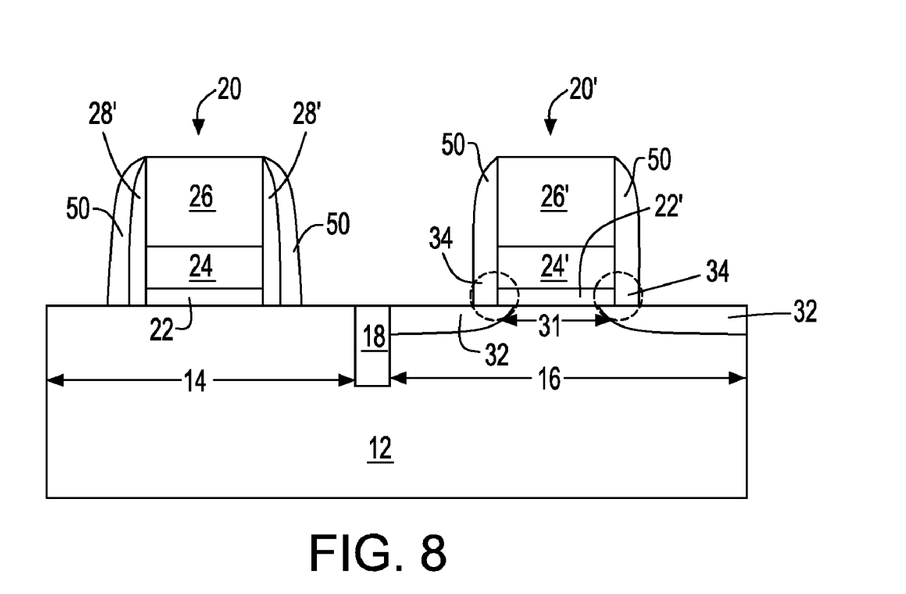
FIG. 8 is a pictorial representation (through a cross sectional view) depicting the structure of FIG. 7 after performing an anneal in an atmosphere that includes at least one workfunction tuning species.

Referring now to FIG. 8, there is illustrated the structure of FIG. 7 after performing an annealing step in which a workfunction tuning species (as defined above) is incorporated within portions of structure as mentioned above within the pFET device region 16. The areas in which the workfunction tuning species are incorporated into the structure are designated by circles shown in FIG. 5 and are labeled as element 34 within the drawings. Area 34 can be referred to as a localized workfunction tuning species area or a localized interface charge containing area. This area can be larger or smaller than shown depending on the conditions of the anneal. It is observed that the workfunction tuning species is introduced into portions of the extension regions 32 that are located next to the channel region 31 in which the gate overlaps the source region and the drain region, both to be subsequently formed. It is also observe that the presence of spacer 28' within the nFET device region 14 blocks the workfunction tuning species from being incorporated into the at least one patterned gate stack 20 within the nFET device region 14.

As stated above, an anneal is performed in this embodiment of the invention in which the annealing atmosphere includes one of workfunction tuning species as defined in the first embodiment of the invention. In one embodiment, oxygen is employed as the workfunction tuning species and thus the anneal is performed in an oxygen-containing ambient. In one embodiment of the invention, the anneal atmosphere including the workfunction tuning species may be comprised solely of the workfunction tuning species. In another embodiment of the invention, the anneal atmosphere including the workfunction tuning species may be diluted with an inert gas such as, for example, helium, argon, neon, xenon or mixtures thereof. In the latter embodiment in which a dilute anneal atmosphere is employed, the workfunction tuning species can be present in a concentration resulting in the dosage incorporated within the pFET device area 16 is from 10E13 atoms/$cm^2$ to 10E19 atoms/$cm^2$, with a dosage from 10E14 atoms/$cm^2$ to 10E18 atoms/$cm^2$ being more typical.

The anneal is performed at a temperature that is capable of diffusing the workfunction species into the above described locations within the pFET device region 16. Typically, the anneal is performed at a temperature from 200° C. to 800° C., with an anneal temperature from 300° C. to 500° C. being more typical. The duration of the anneal may vary. Typically, however, the duration of the anneal is from 5 seconds to 10 minutes, with a duration from 10 seconds to 5 minutes being more typical.

The anneal can include a rapid thermal anneal, a furnace anneal, a microwave anneal or a laser anneal. In some embodiments in which the localized workfunction tuning area 34 is formed only into one side of the patterned gate stack, a block mask can be formed which protects one side of the patterned gate stack, while leaving the other side exposed.

After performing the anneal, conventional CMOS processing including formation of source/drain regions, formation of metal semiconductor alloy contact regions, formation of one or more stress liners, formation of a middle of the line dielectric material, and formation of metal contact vias within the middle of the liner dielectric can be performed.

Without wishing to be bound by any theory, the presence of the localized workfunction tuning area 34 within the pFET device region 16 is believed to control the gate induced drain leakage (GIDL) by modifying the local workfunction at the gate/SD (source/drain) overlap region. Moreover, the presence of area 34 within the pFET device region 16 shifts the workfunction of the at least one gate stack 20' to flatband condition at the gate/SD overlap region so that the gate induced drain leakage is reduced, while the workfunction within the device channel is not changed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
  a semiconductor substrate including at least one patterned gate stack located within a pFET device region of said semiconductor substrate, said at least one patterned gate stack comprises a high k gate dielectric located on an upper surface of said semiconductor substrate, and a metal gate electrode located atop the high k gate dielectric;
  a spacer located on said upper surface of said semiconductor substrate, said spacer having an inner edge in contact with a vertical sidewall of said at least one patterned gate stack and an opposing outer edge;
  extension regions located within said semiconductor substrate at a footprint of said at least one patterned gate stack;
  a channel region located within said semiconductor substrate beneath said at least one patterned gate stack; and
  a localized workfunction tuning area located within a portion of at least one of said extension regions that is positioned adjacent said channel region, but not extending beyond said outer edge of said spacer, and within at least one sidewall portion of the at least one gate stack including a sidewall portion of the high k gate dielectric and the metal gate electrode, wherein other portions of said at least one of said extension regions that extend beyond the outer edge of said spacer, and other portions of said at least one patterned gate stack adjacent said at least one sidewall portion of said patterned gate stack are void of said localized workfunction tuning area.

2. The semiconductor structure of claim 1 wherein said localized workfunction tuning area includes a workfunction tuning species selected from one of fluorine, bromine, chlorine, iodine, oxygen, and sulfur.

3. The semiconductor structure of claim 2 wherein said workfunction tuning species is fluorine or oxygen.

4. The semiconductor structure of claim 1 wherein said at least one patterned gate stack further comprises a doped layer of a Si-containing material atop said metal gate electrode.

5. The semiconductor structure of claim 1 further comprising at least one patterned gate stack within an nFET device region, said at least one patterned gate stack within said nFET device region is devoid of said localized workfunction tuning species area.

6. A method of forming a semiconductor structure comprising:
  forming at least one patterned gate stack within a pFET device region of a semiconductor substrate;
  forming extension regions within said semiconductor substrate at a footprint of the at least one patterned gate stack, wherein said extension regions define a channel region located beneath the at least one patterned gate stack;
  introducing a workfunction tuning species by angled ion implantation into a portion of at least one of said extension regions that is located adjacent to the channel region of the at least one patterned gate stack and into at least one sidewall portion of the at least one patterned gate stack; and
  forming a spacer on said semiconductor substrate with said pFET device region, said spacer having an inner edge in contact with a vertical sidewall of said at least one patterned gate stack in said pFET device region and an opposing outer edge.

7. The method of claim 6 wherein said angled ion implantation comprises selecting at least one of fluorine, bromine, chlorine, iodine, oxygen, and sulfur as an implant ion.

8. The method of claim 6 wherein said angled ion implantation is performed utilizing a tilt angle from 5° to 45°.

9. The method of claim 8 wherein said at least one workfunction tuning species is implanted using an ion dose from $10E13$ atoms/cm$^2$ to $10E19$ atoms/cm$^2$.

10. The semiconductor structure of claim 1 wherein said localized workfunction tuning area is present on only one side of said at least one patterned gate stack.

11. The method of claim 6 wherein said introducing the workfunction tuning species occurs only on one side of said at least one patterned gate stack.

12. The method of claim 6 further comprising forming at least one patterned gate stack within an nFET device region of the semiconductor substrate, and protecting the nFET device region during said introducing said workfunction tuning species.

13. A method of forming a semiconductor structure comprising:
  forming at least one patterned gate stack within a pFET device region of a semiconductor substrate and at least one patterned gate stack within an nFET device region of said semiconductor structure;
  forming extension regions within said semiconductor substrate at a footprint of the at least one patterned gate stack within said pFET device region, wherein said extension regions define a channel region located beneath the at least one patterned gate stack within said pFET device region; and
  introducing a workfunction tuning species by only an anneal process comprising an atmosphere containing said workfunction tuning species into a portion of at least one of said extension regions that is located adjacent to the channel region of the at least one patterned gate stack within said pFET device region and into at least one sidewall portion of the at least one patterned gate stack within said pFET device region, wherein said at least one patterned gate stack within said nFET device region is protected during said introducing said workfunction tuning species.

14. The method of claim 13 wherein said anneal process is performed at a temperature from 300° C. to 600° C.

15. The method of claim 13 wherein said introducing the workfunction tuning species occurs only on one side of said at least one patterned gate stack.

* * * * *